United States Patent [19]
Kozuka

[11] Patent Number: 5,229,846
[45] Date of Patent: Jul. 20, 1993

[54] SEMICONDUCTOR DEVICE HAVING NOISE REDUCING DIE PADS

[75] Inventor: Eiji Kozuka, Yokohama, Japan

[73] Assignee: Kabushiki Kaisha Toshiba, Kawasaki, Japan

[21] Appl. No.: 746,026

[22] Filed: Aug. 12, 1991

[30] Foreign Application Priority Data

Aug. 10, 1990 [JP] Japan ................ 2-213050

[51] Int. Cl.⁵ .................. H01L 23/02; H01L 23/12
[52] U.S. Cl. .................... 257/678; 257/666
[58] Field of Search .................. 357/70, 74

[56] References Cited
U.S. PATENT DOCUMENTS 4,725,692  2/1988  Islii et al. ............... 357/70

FOREIGN PATENT DOCUMENTS

WO86/05322  9/1986  World Int. Prop. O.

*Primary Examiner*—Georgia Y. Epps
*Assistant Examiner*—Robert E. Wise
*Attorney, Agent, or Firm*—Foley & Lardner

[57] ABSTRACT

In a semiconductor device including a semiconductor chip, a lead frame with a die pad and plural leads, and a sealing body. The die pad is divided into a plurality of small pieces, and at least one of the plural divided pieces is electrically connected to at least one lead to which a potential is applied. Since the divided die pad is used as a wiring lead, the inductance and resistance of the voltage supply line or the ground line within the chip can be reduced, thus reducing the occurrence of supply voltage and output noise for prevention of erroneous operation.

8 Claims, 10 Drawing Sheets

PRIOR ART

FIG. 12A  $\phi_1$

FIG. 12E  OUT

INVENTION

FIG. 12F  $\phi_1$

FIG. 12J  OUT

SEMICONDUCTOR DEVICE HAVING NOISE REDUCING DIE PADS

BACKGROUND OF THE INVENTION

The present invention relates to a semiconductor device, and more specifically to a semiconductor device on which a chip having a plurality of input pads for voltage supply or ground is mounted.

Recently, semiconductor memory devices, in particular, dynamic RAMs have been improved. They are now used in circuits having higher integration and larger capacities. However, charges on and discharges from bit lines connected to these memory cells tend to increase. As a result, the charge/discharge current increases and the potential of the voltage supply or ground fluctuates (referred to as voltage supply noise) due to wire inductance and resistance, thus exerting a harmful influence upon circuit operation speed.

Figure 13A:
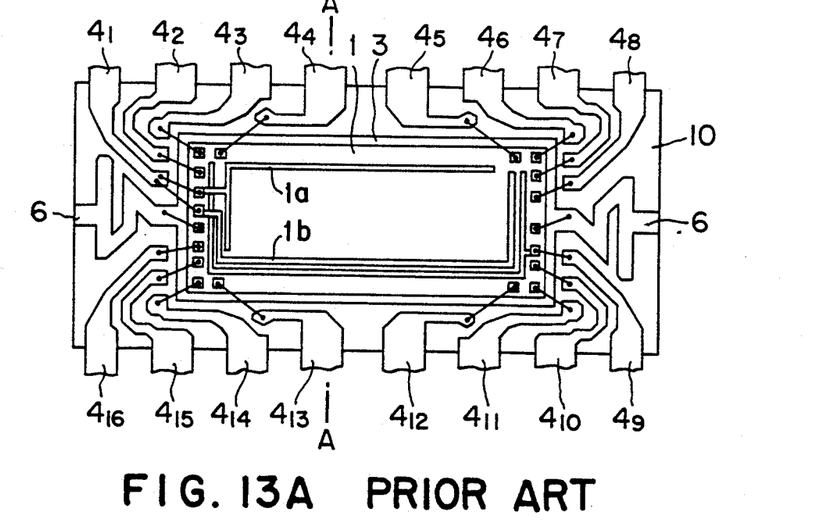
FIGS. 13A and 13B are plan views showing the semiconductor device using a conventional package.
Figure 13B:
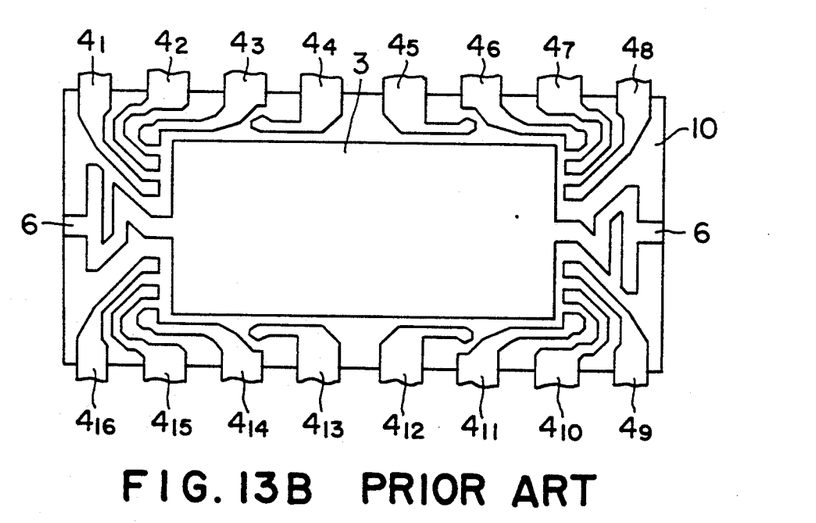
Figure 13C:
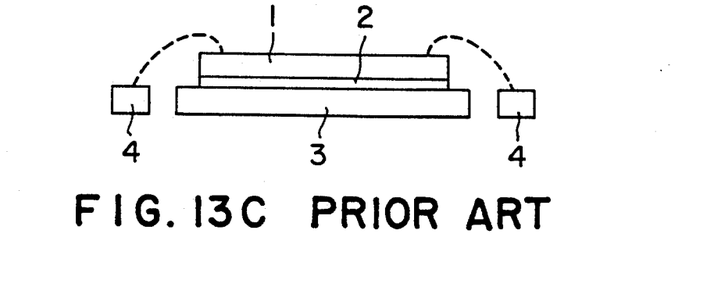
FIG. 13C is a cross-sectional view taken along the line A—A in FIG. 13A.

FIGS. 13A to 13C show an internal configuration of a package for a conventional semiconductor device of the dual-in-line package (DIP) type. FIG. 13A is a plan view showing the bonding status; FIG. 13B is a plan view showing a lead frame from which a semiconductor chip is removed; and FIG. 13C is a cross-sectional view taken along the line A—A in FIG. 13A.

As shown in FIG. 13A, major voltage supply lines $1a$ and $1b$ are arranged on a wire-bonded semiconductor chip 1 located at the middle portion of a resin sealing body 10. The semiconductor chip 1 is mounted on a die pad 3 of a lead frame by a conductive adhesive (e.g. conductive paste) 2, and bonding pads of the semiconductor chip 1 are connected to lead terminals $4_1$ to $4_{16}$ of the lead frame via bonding wires. Further, two tie bars 6 are connected to the die pad 3. These tie bars 6 serve to support the die pad 3 at the frame portion of the lead frame before the chip 1 is sealed by resin. However, these tie bars 6 are cut away from the frame after the chip 1 has been sealed by resin.

In the case shown in FIG. 13A, the pin (lead terminal) $4_1$ located at the upper leftmost position is a voltage supply pin. This voltage supply pin is connected to two input pads arranged on the semiconductor chip 1 via bonding wires. One of these two input pads is a voltage supply line $1a$ for a main (core) circuit and the other thereof is a voltage supply line $1b$ for peripheral circuits. Since these voltage supply lines $1a$ and $1b$, divided into two systems, are provided independently inside the semiconductor chip 1, it is possible to prevent voltage supply noise generated by the core circuit due to charge/discharge current through the bit lines from exertion a harmful influence upon the peripheral circuits.

Recently, there exists a tendency such that the semiconductor chip is increased in size but miniaturized in configuration, so that the wires arranged in the semiconductor chip 1 increase in length but decrease in diameter. Therefore, the inductance and resistance of each of the wires (e.g. Al) arranged on the semiconductor chip tend to increase markedly.

As a result, there arises a new problem in that an erroneous operations occur due to charge/discharge current when the circuit is in operation, which has been so far disregarded. As one example, it is known that the potential of the voltage supply or ground fluctuates (referred to as output noise) due to the charge/discharge current caused by an external load capacitance of an output buffer. The above-mentioned fluctuations become further noticable with an increasing number of input/outputs (I/O), thus reducing the circuit operation speed.

In general, almost all voltage supply noise is caused by the inductance component of the lead frame. Conventionally, since the charge/discharge capacitance has required increase, or a high speed switching operation required without reducing the parasitic inductance component of the lead frame, the supply voltage noise and output noise exert a harmful influence upon the chip internal circuits with an increasing capacity of the semiconductor chip.

SUMMARY OF THE INVENTION

The object of the present invention is to provide a semiconductor device which can reduce the inductance and resistance components of voltage supply lines within a chip to eliminate noise.

In the semiconductor device according to the present invention, the die pad of a lead frame is divided into a plurality of small pieces, and at least one of these plural small pieces is electrically connected to at least one lead.

According to the present invention, since the die pad on which a semiconductor chip is mounted is divided into plural small pieces so that at least one of them can be used as a signal transmitting lead for voltage supply or ground, it is possible to eliminate the influence of inductance and resistance upon the circuits. That is, it is possible to realize a semiconductor device which will not generate supply voltage noise or output noise and therefore can prevent erroneous operation, by utilizing the die pad itself as at least one wiring.

BRIEF DESCRIPTION OF THE DRAWINGS

In the attached drawings.

DETAILED DESCRIPTION OF THE PREFERRED EMBODIMENTS

Figure 1A:
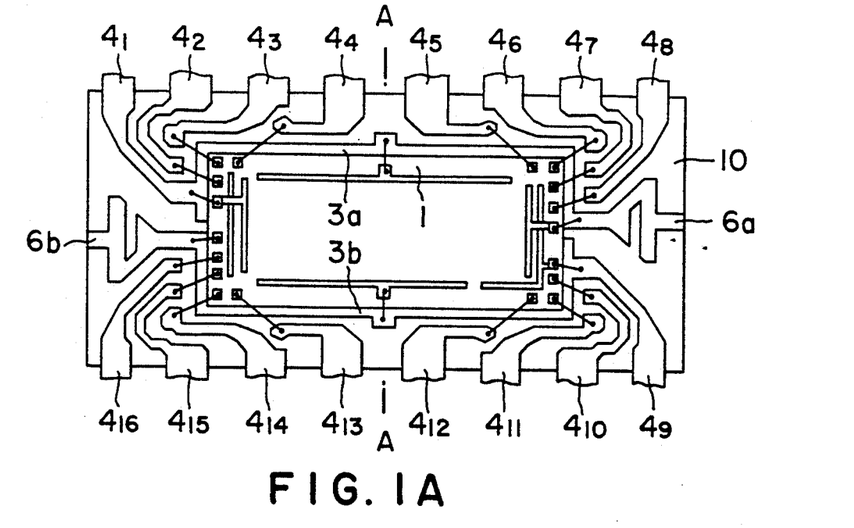
FIG. 1A, FIG. 2A and FIG. 3A are plan views showing semiconductor devices of embodiments of the present invention, in which a semiconductor ship is mounted on a lead frame.
Figure 1B:
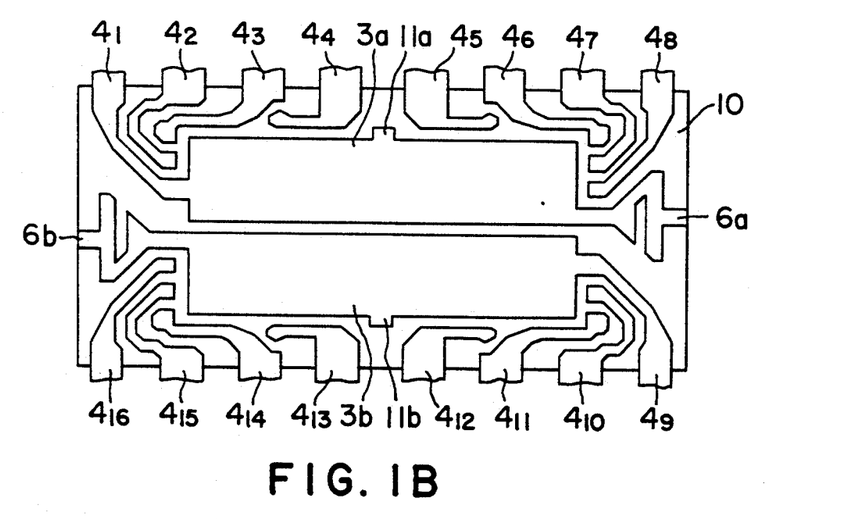
FIG. 1B, FIG. 2B and FIG. 3B are plan views showing the semiconductor devices, in which the semiconductor chip is removed from the lead frame.
Figure 1C:
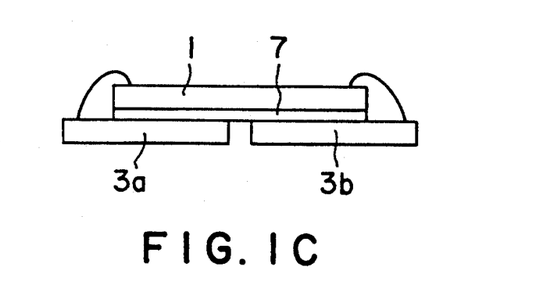
FIG. 1C, FIG. 2C and FIG. 3C are cross-sectional views taken along the line A—A in FIGS. 1A, 2A and 3A, respectively.
Figure 2A:
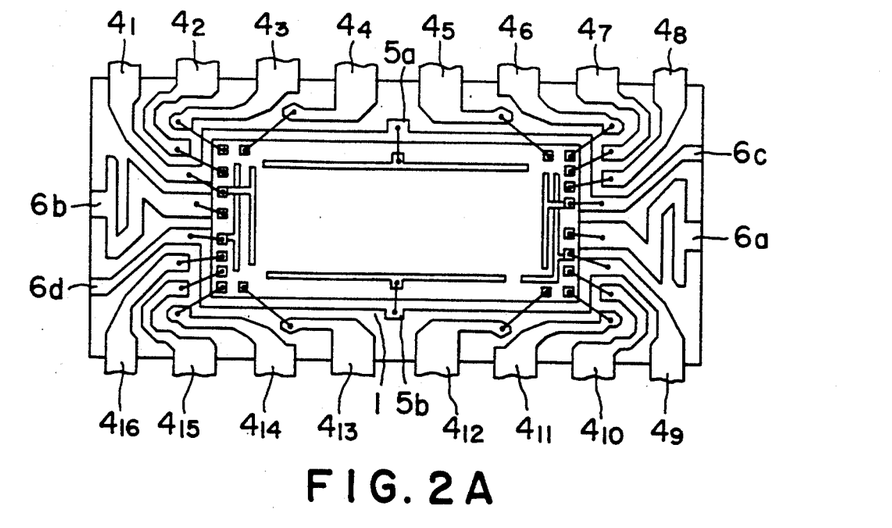
Figure 2B:
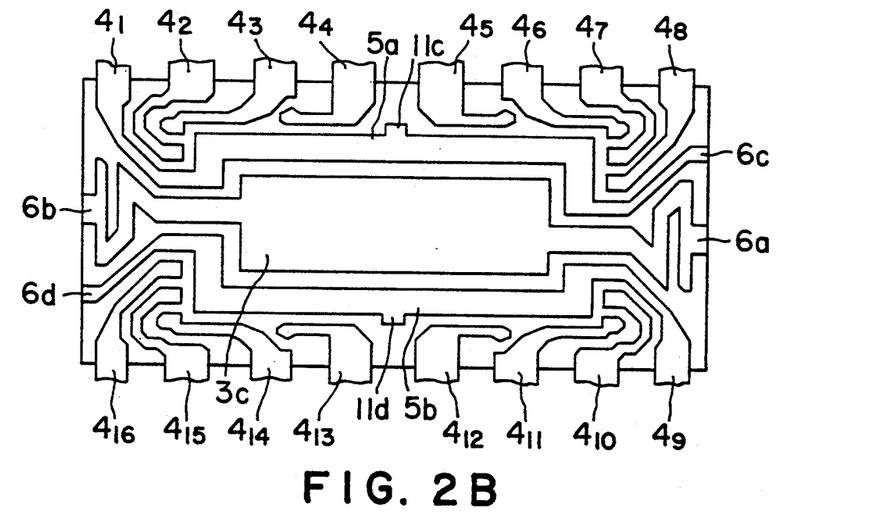
Figure 2C:
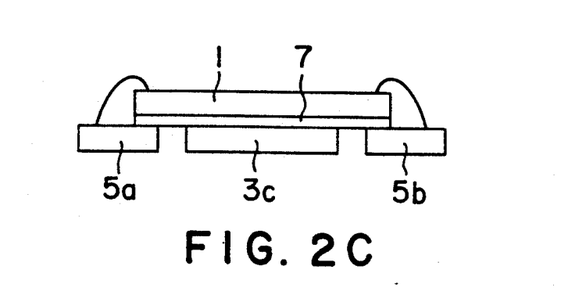

FIGS. 1A, 1B and 1C show an embodiment of the present invention, which is the same in structure as the conventional package shown in FIGS. 13A, 13B and 13C, except for die pad 3. Therefore, the same reference numerals have been retained for similar parts which have the same functions, without repeating the description thereof. In this embodiment, the die pad 3 is divided into two pads 3a and 3b, and in addition one of the tie bars 6a and 6b is used in common as an input pin. In more detail, the die pad 3a shown on the upper side in FIG. 1B is connected to the right side tie bar 6a and the pin $4_1$, and the die pad 3b shown on the lower side is connected to the left side tie bar 6b and the pin $4_9$, respectively. The lead frame structure related to the other pins is the same as with the case of the conventional package. Further, in this embodiment, although two bonding spaces 11a and 11b are provided at the middle portion (between pins $4_4$ and $4_5$ in the pad 3a and between pins $4_{12}$ and $4_{13}$ in the pad 3b) of the die pad 3, these spaces are not necessarily required as far as there exist sufficient bonding spaces at the semiconductor chip 1 and the die pad 3. The semiconductor chip 1 is bonded onto the die pads 3a and 3b by an insulating adhesive (e.g. insulating paste) or via an insulating film 7 bonded by an insulating adhesive. FIGS. 2A, 2B and 2C show another embodiment of the present invention. In this embodiment, the die pad 3 is divided into three pads 5a, 5b and 3c, and the main die pad 3c is fixed to the right and left tie bars 6a and 6b as is usual. However, the area of the die pad 3c in contact with the semiconductor chip 1 is smaller than that of the semiconductor chip 1. As understood in FIG. 2C, two die subpads 5a and 5b are arranged on both sides of the main die pad 3c. Further, the subpad 5a is supported by the input pin $4_1$ and a newly formed tie bar 6c, and the subpad 5b is supported by the input pin $4_9$ and a newly formed tie bar 6d. Two bonding spaces 11c and 11d are provided at the middle portions of these die subpads 5a and 5b, respectively.

In the same way as shown in FIG. 1C, the semiconductor chip 1 is bonded onto the die pad 3 by an insulating adhesive (e.g. insulating paste) or via an insulating film 7 bonded by an insulating bonding agent.

Figure 3A:
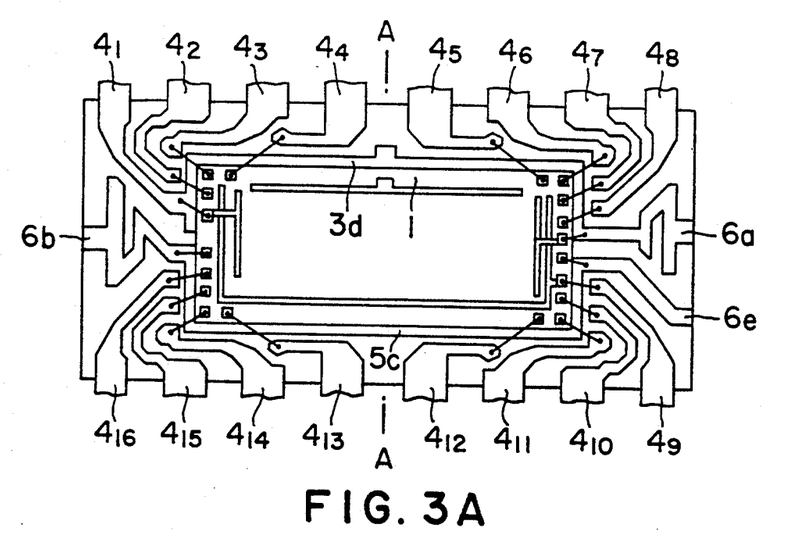
Figure 3B:
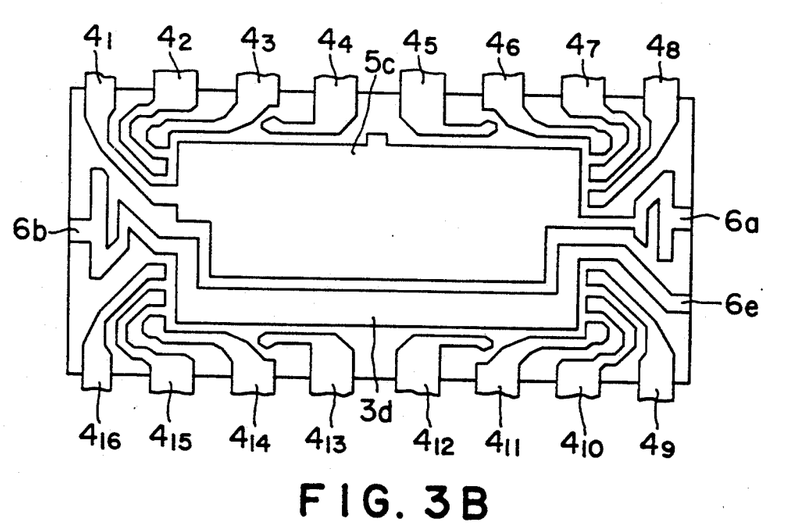
Figure 3C:
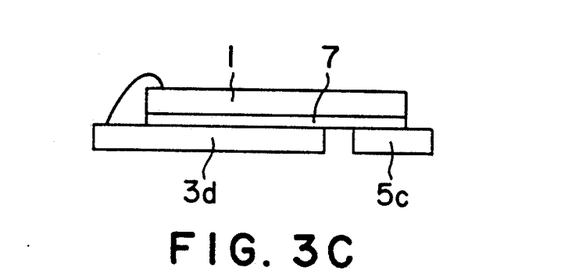

FIGS. 3A, 3B and 3C show a further embodiment of the present invention. In this embodiment, the die pad 3 is divided into a large pad 3d and a small pad 5c. The die pad 3d is supported by the input pin $4_1$ and an additional tie bar 6a. The die pad 5c is supported by tie bars 6b and 6e. The semiconductor chip 1 is fixed to the die pads 3d and 5c in the same way as in FIG. 2C. The reason why a difference in area is provided is that a large pad is connected to a large lead of the voltage supply line from which noise tends to be generated.

Figure 4:
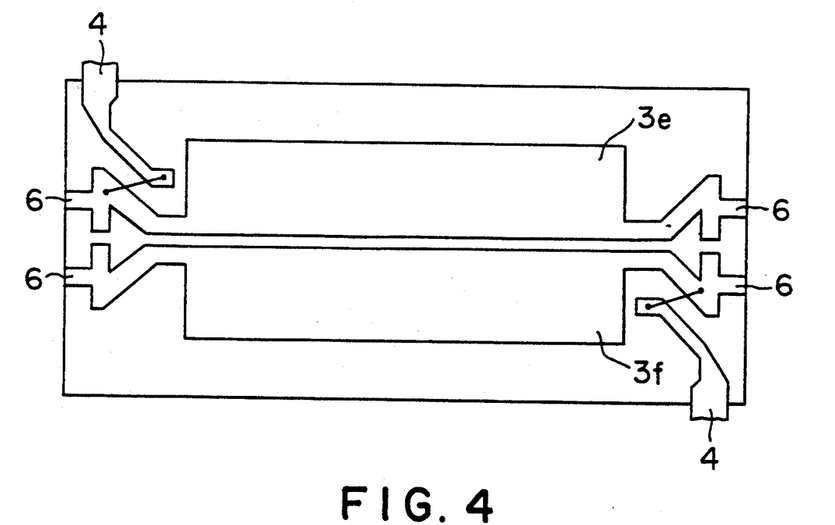
FIGS. 4 to 8 are plane views showing other embodiments of the present invention.

FIG. 4 shows another embodiment, in which divided die pads 3e and 3f are connected to the input pins 4 via bonding wires, respectively.

Figure 5:
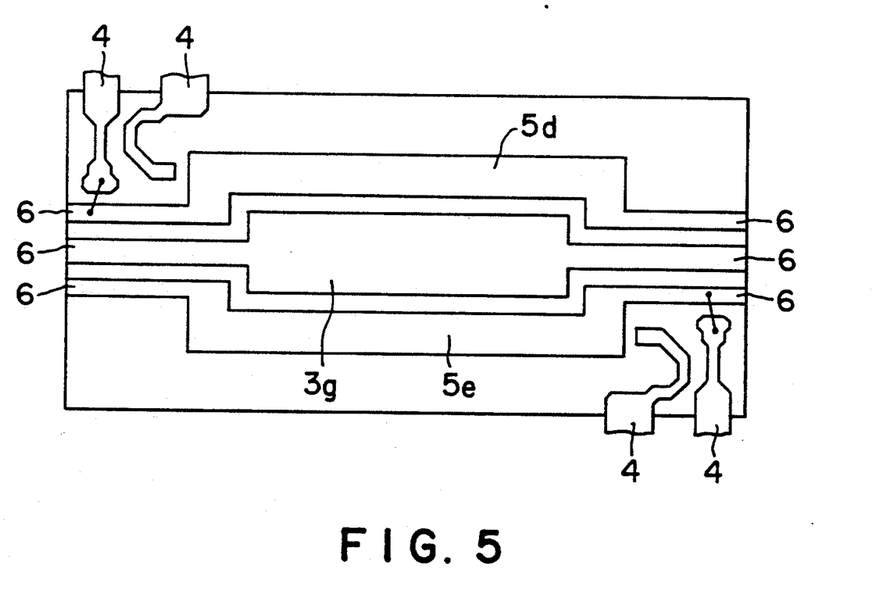

FIG. 5 shows another embodiment, in which two die pads 5d and 5e of three divided die pads 3g, 5d, and 5e are connected to the input pins 4 via bonding wires, respectively near the tie bars 6.

Figure 6:
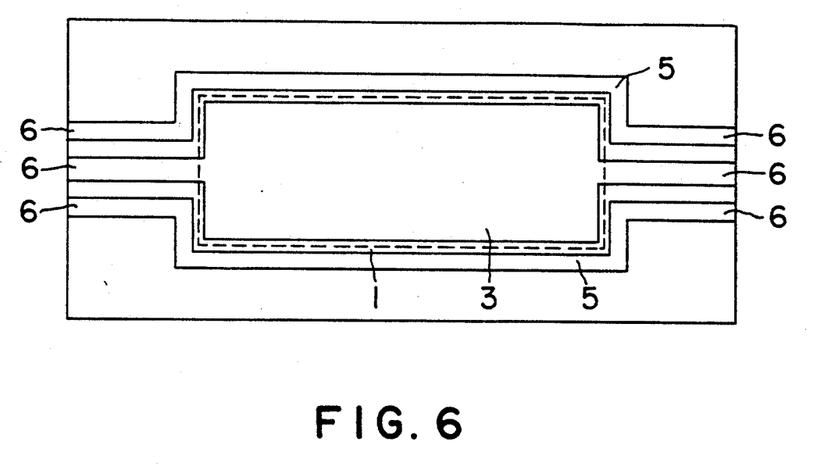
Figure 7:
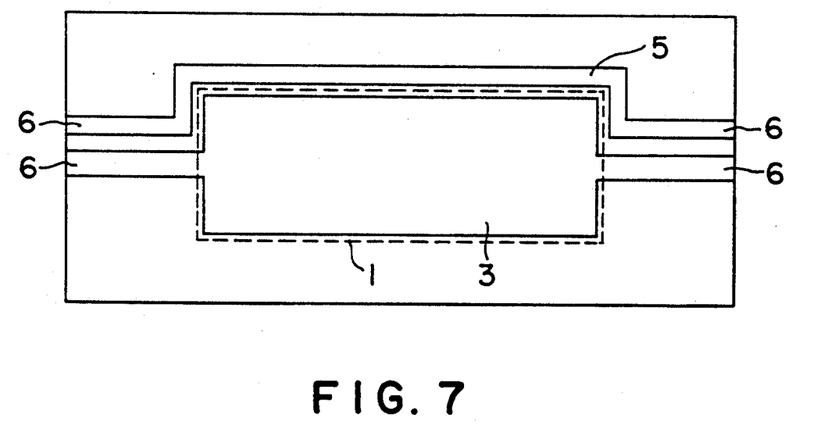

FIG. 6 shows another embodiment corresponding to that shown in FIG. 2, in which the die pad 3 is divided into three pads. FIG. 7 shows another embodiment corresponding to that shown in FIG. 3, in which the die pad 3 is divided into two pads. In these embodiments, the size of the die subpad 5 is determined so as not to be overlapped with the chip 1 after die bonding. Further, in FIGS. 6 and 7, although the die pads 5 are connected to the tie bars 6, one end of each of die pads 5 can be connected to an input pin as shown in FIG. 2 or 3. In this case, the semiconductor chip 1 can be fixed to the die pads by use of any of conductive paste, insulating paste and insulating film.

The above mentioned embodiments are of DIP type package. However, FIG. 8 shows a package of ZIP type.

Figure 10:
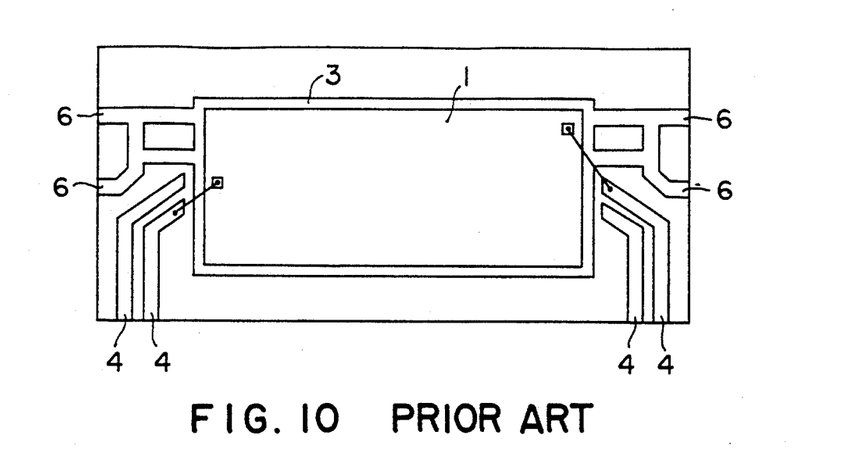
FIG. 10 is a plan view showing a semiconductor device using a conventional ZIP type package.

Further, for comparison FIG. 10 shows a conventional package of ZIP type, in which only a single die pad 3 is provided.

Figure 8:
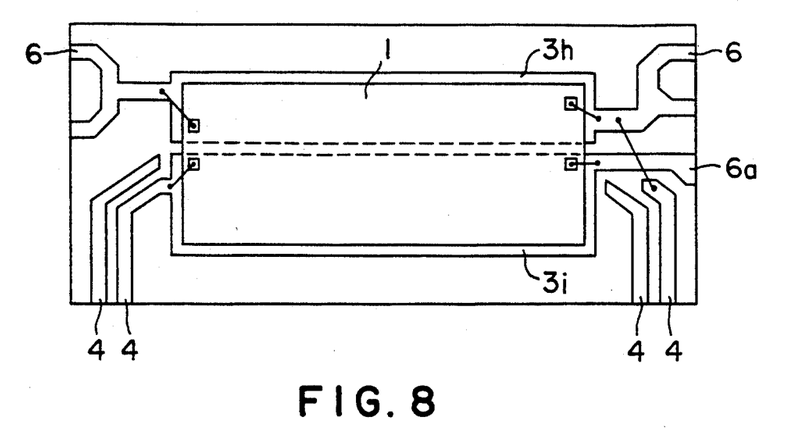

In FIG. 8, both the sides of the upper die pad 3h of the two divided die pads 3h and 3i and tie bars 6 are connected to input pins 4 via two bonding wires to supply an input signal potential. Further, one end of the lower die pad 3i is a tie bar 6a and the other end thereof is connected to an input pin 4. The semiconductor chip 1 is fixed to the die pads 3h and 3i by an insulating paste or film.

The reason why supply voltage noise or output noise can be reduced by the present invention will be described hereinbelow.

Figure 11A:
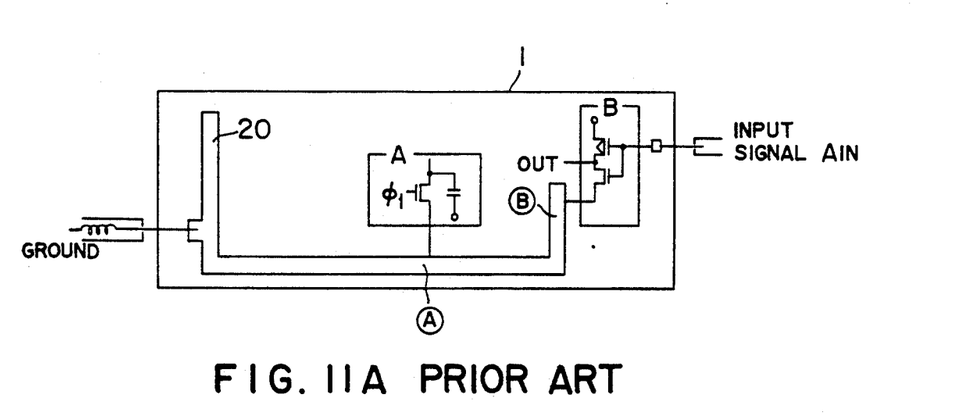
FIG. 11A is a circuit wiring diagram of the semiconductor device using the conventional semiconductor package for explaining the circuit operation thereof.
Figure 11B:
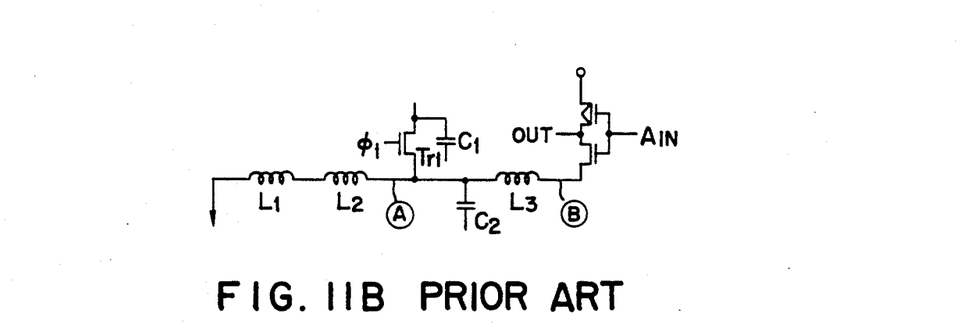
FIG. 11B is an equivalent circuit diagram of the circuit shown in FIG. 11A.

FIG. 11A shows the connection relationship between a ground terminal and circuits arranged on a semiconductor chip 1 mounted on a conventional semiconductor package where the die pad is not divided, and FIG. 11B shows an electrically equivalent circuit thereof.

As shown in FIG. 11A, two circuits A and B are connected to a single ground line 20 at points (A) and (B), respectively. Further, FIGS. 12A to 12E show waveforms of the conventional device, and FIGS. 12F to 12J show those of the device according to the present invention.

Figure 12A:
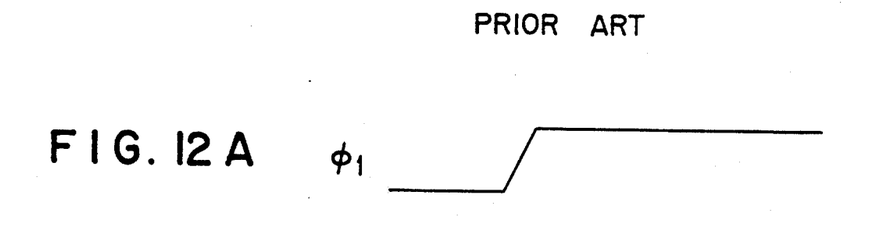
FIGS. 12A to 12E show waveform diagrams for assistance in explaining the circuit operation of the device using the conventional package.
Figure 12B:
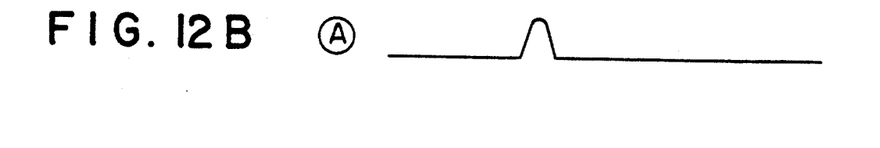
Figure 12C:
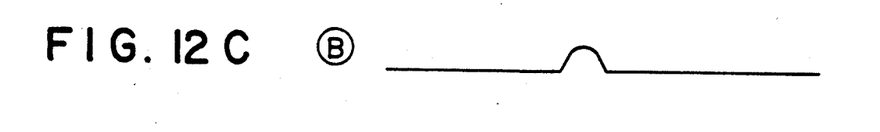
Figure 12D:
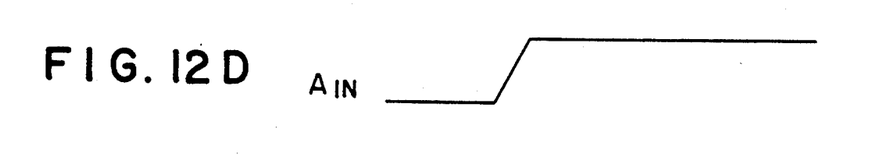
Figure 12E:
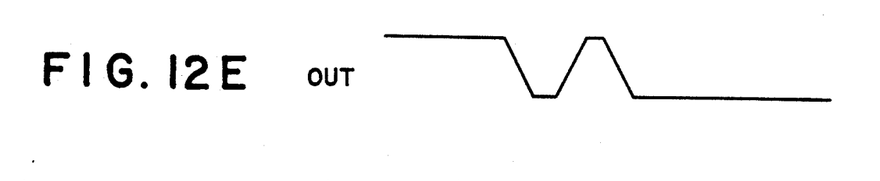
Figure 12F:
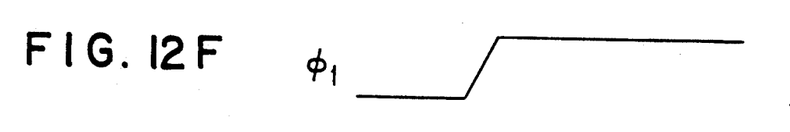
FIGS. 12F to 12J show waveform diagrams for assistance in explaining the circuit operation of the device using the package according to the present invention.
Figure 12G:
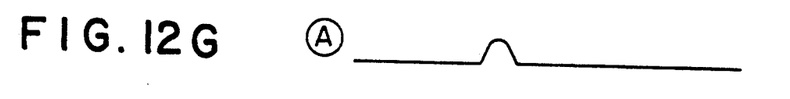

Now, when an "H"-level signal $\phi_1$ as shown in FIGS. 12A and 12F is applied to a gate of a transistor $Tr_1$ of the circuit A, an electric charge of a capacitor $C_1$ of the circuit A is discharged to the ground line 20. In this case, since the ground point (A) is connected to the ground terminal via two inductances $L_1$ and $L_2$, the potential at the ground point (A) rises momentarily, so that noise is generated as shown in FIG. 12B and FIG. 12G. Further, since a sum of these two inductances $L_1$ and $L_2$ is larger than an inductance $L_3$ existing between the two ground points (A) and (B), in the case of the conventional device, the potential at the ground point (B) rises, as shown in FIG. 12C, following the rise at the ground point (A). Further, a difference (distortion) in waveform between the two ground points (A) and (B) is caused by the inductance L, the capacitance C and the resistance R at the ground point 20. Where the potential rises at the ground point (B), even if an input signal $A_{IN}$ as shown in FIG. 12D, rises to "H" level, a rise in the potential Vss at the point (B) is equivalent to a drop in the potential of the input signal $A_{IN}$, so that an erroneous operation occurs such that the level of the output OUT of the circuit B rises, as shown in FIG. 12E, as if an "L"-level pulse is applied to the input signal $A_{IN}$.

Figure 9A:
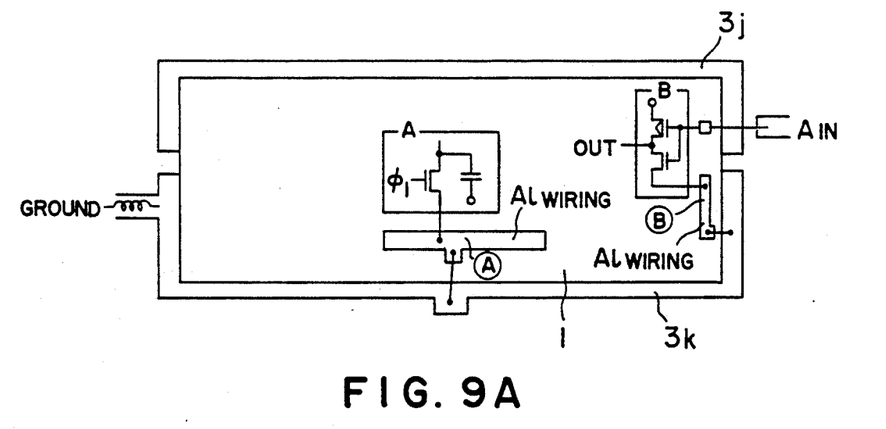
FIG. 9A is a circuit wiring diagram of the present invention explaining the effect of reducing signal noise.
Figure 9B:
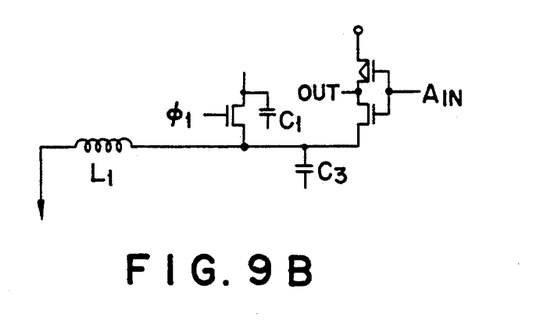
FIG. 9B is an equivalent circuit diagram of the circuit shown in FIG. 9A.
Figure 12H:
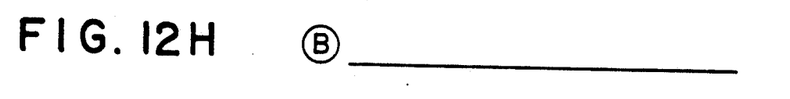
Figure 12I:
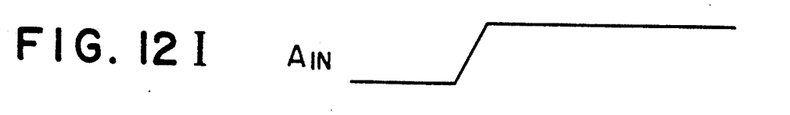
Figure 12J:
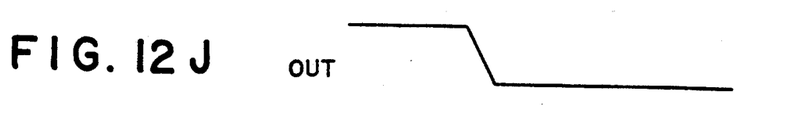

In contrast With this, in the case where a package of the present invention is used, since a die pad 3k of the two divided die pads 3j and 3k is used as a ground line, it is possible to neglect the inductances $L_2$ and $L_3$ as represented by an equivalent circuit shown in FIG. 9B. In addition, since the capacitance $C_3$ between the die pads 3k and 3j and the chip 1 is larger than the capacitance $C_2$ of the wire on the conventional chip, there exists such an effect that fluctuations can be suppressed at the ground point (A). As a result, a rise in potential at the ground point (A) will not be transmitted to the ground point (B) as shown in FIG. 12H, so that no erroneous operation occurs at the circuit output OUT as shown in FIG. 12J.

As described above, in the semiconductor device according to the present invention, since the die pad on which a semiconductor chip is mounted is divided and further at least one of the divided die pads is used as a wiring lead, it is possible to reduce the values of inductance and resistance down to such an extent as to be negligible. Therefore, it is possible to realize a semiconductor device which can prevent the occurrence of supply voltage noise or output noise and thereby eliminate the occurrence of erroneous operation.

What is claimed is:

1. A semiconductor device including a semiconductor chip, a lead frame composed of a die pad for mounting the semiconductor chip thereon and a plurality of leads each having one end located near the die pad and its other end located outside of a package, and a sealed body made by resin molding said semiconductor chip and said lead frame except the other end of each lead, wherein the die pad is divided into a plurality of small pieces, and at least one of the plural divided pieces is electrically connected to at least one of the leads to which a predetermined potential is applied.

2. The semiconductor device of claim 1, wherein the size of each of the plural small pieces is different from each other, and a larger piece is connected to a lead on which noise is likely to be generated.

3. The semiconductor device of claim 2, wherein the die pad is divided into a relatively large main middle piece and two relatively small subpieces, each subpiece located on one or the other side of the main piece.

4. The semiconductor device of claim 3, wherein the semiconductor chip is fixed to and supported by both the main piece and the two subpieces, said main piece and said two subpieces being insulated from each other.

5. The semiconductor device of claim 3, wherein the semiconductor is fixed to and supported by only the main piece.

6. The semiconductor device of claim 1, wherein the die pad is divided into a relatively large main piece and a relatively small subpiece adjacent to the main piece.

7. The semiconductor device of claim 6, wherein the semiconductor chip is fixed to and supported by both the main piece and the subpiece, said main piece and said subpiece being insulated from each other.

8. The semiconductor device of claim 6, wherein the semiconductor chip is fixed to and supported only by the main piece.

* * * * *